US005528446A

United States Patent [19]
Sankaran et al.

[11] Patent Number: 5,528,446
[45] Date of Patent: Jun. 18, 1996

[54] INTEGRATED POWER MODULE DIAGNOSTIC UNIT

[75] Inventors: Venkateswara Sankaran, Farmington Hills; Xingyi Xu, Canton, both of Mich.

[73] Assignee: Ford Motor Company, Dearborn, Mich.

[21] Appl. No.: 270,611

[22] Filed: Jul. 5, 1994

[51] Int. Cl.⁶ .................................................. H02H 5/04
[52] U.S. Cl. ............................... 361/25; 361/103; 361/78
[58] Field of Search .............................. 361/18, 25, 103, 361/27, 78, 23; 364/483; 340/648

[56] References Cited

U.S. PATENT DOCUMENTS

| | | | |
|---|---|---|---|
| 4,441,136 | 4/1984 | Hampshire | 361/88 |
| 4,470,092 | 9/1984 | Lombardi | 361/23 |
| 4,796,142 | 1/1989 | Libert | 361/23 |
| 4,965,504 | 10/1990 | Ueda et al. | 318/802 |
| 5,173,832 | 12/1992 | Giorgetta et al. | 361/88 |
| 5,189,350 | 2/1993 | Mallett | 318/434 |
| 5,214,559 | 5/1993 | Zerbian et al. | 361/93 |

*Primary Examiner*—Todd DeBoer
*Attorney, Agent, or Firm*—Peter Abolins; Roger L. May

[57] ABSTRACT

An integrated power module combining drivers and power devices includes a diagnosis module integrated with or connected to the integrated power module. That includes protectors. The protectors provides protection against power device failure, transistor stack failure, gate drive failure, power failure, and other conditions. In a first level of diagnosis and protection, a gate driver is responsive to hard faults, such as short circuit and under voltage conditions, to disenable the power devices, for example, switching transistors of an inverter. In addition, the first level of protection includes soft faults, such as detection of overcurrent and over temperature in the power device, conditions that are merely reported to the controller, whereby the number and frequency of the events can be monitored. The second level of protection also provided by the diagnostic module may include power interlock to ensure that full power is being delivered to the integrated power module. The system permits detection of a transistor stack failure by monitoring the thermal resistance of the stack layers or junctions to detect physical degradation of the junctions and determine when the level of deterioration exceeds a pre-determined level. In addition, a power cycling failure diagnosis determines the integrity of the wirebonds, for example, wirebonds joining a silicon die to appropriate metal land patterns, as well as the integrity of stack junctions.

11 Claims, 3 Drawing Sheets

INTEGRATED POWER MODULE DIAGNOSTIC UNIT

TECHNICAL FIELD

This invention relates to electronic controls for motor vehicles and, more particularly, to power driver controls having condition diagnostic protection circuits.

BACKGROUND ART

In an automobile there are numerous actuators such as motors, pumps and fans. Due to increased environmental concerns and emission regulations, there are efforts underway to convert the fixed speed, on/off controlled drives and hydraulic systems for such actuators to more efficient adjustable speed electric drives. This would help improve fuel economy and, therefore, reduce undesirable emissions.

These drives are useful in high performance applications, such as electric active suspension, to meet customer demands. Adjustable speed A.C. motor drives consist of DC/AC inverters, and switching power supplies and controlled rectifiers employ DC/DC converters. All these power electronic circuits consist of power devices arranged in certain circuit configurations. An effort to add the power devices, gate drivers and protection circuits would substantially increase the complexity, cost and packaging disadvantages that offset convenient implementation of such features.

In motor vehicles, these modules have to operate in harsh environments. External causes of stress, such as, temperature, humidity, salt spray, etc. can accelerate the various internal failure modes such as power device failure, transistor stack failure, gate drive failure, power failure and erroneous input commands, in addition to the internal factors of the module. While previously known detectors may warn of current conditions, the condition of the power module has not been reported to the controller periodically in a manner that would allow the controller to anticipate problems, make intelligent decisions and inform the driver of any problems or servicing requirements that a diagnosis may suggest.

The types of failures can be classified as open circuits, short circuits and slow deterioration. Open circuit faults are caused by broken wirebonds, loose terminals or physical degradation. Short circuit faults result from failed devices, thermal melt down or edge termination failures. Slow deterioration of the module could result from the influence of the external ambient factors. In any event, it is difficult to track many failure mechanisms, particularly the numbers of or degrees of failure in the system over its lifetime, although certain electrical parameters and temperature can be monitored by previously known devices.

SUMMARY OF THE INVENTION

This invention overcomes the above disadvantages by tracking some of the failure mechanisms in an integrated power module with condition diagnostic protection. Such protection may include a diagnostic module which would tie a controller to the integrated power module although implementation may be integrated with or separately added onto the integrated power module. The integrated power module includes power devices, a gate driver section for each power device and a device level protection circuit.

A protection circuit preferably provides a first level of protection to protect the power device under short circuit, over current, over temperature and under voltage conditions. If the device is subjected to any of the hard fault conditions such as short circuit and undervoltage conditions, the protection circuit could disable the power device in a well known manner. For example, a shortcircuit in a power transistor switch such as an insulated gate bipolar transistor (IGBT) switch is detected using desaturation detection technique, where detection of high level voltage at the collector disenables the gate driver to avoid output to the power devices. An undervoltage in the power signal to the gate driver is detected when power signal voltage is less than a predetermined level and also disenables the gate driver from triggering the power device. In addition, the condition in the integrated power module would be reported by the diagnostic module to the controller. In the case of soft faults, such as over current and over temperature conditions, the integrated power module diagnostic unit would merely report the status to the controller and let the controller make the decision.

In the preferred embodiment, the power devices are switching transistors coupled to form an inverter. At start-up, a start-up sequence check is performed, where the voltage sensor output can be used to check if the switches are switching as commanded by the controller. The reaction to a sample pulse to turn on the switch is monitored to determine if the gate driver, gate wirebond, gate connections, gate resistor, and related components are intact and functional.

The present invention provides a power drive unit that would help to detect problems, diagnose the severity of the problem and protect the integrated power modules and prevent any catastrophic failure. Some of the diagnostic features, such as start-up sequence, would be on-board, while others, such as type and location of faults, would be useful while servicing the vehicle.

Accordingly, the present invention provides an integrated power module for driving a load device in a motor vehicle, wherein a gate driver actuates a power driver in response to an input voltage command and at least one protector includes a detector circuit for generating a signal in response to a fault or to a physical degradation over time at the power driver. In addition, the present invention provides a power device drive system with condition diagnostic protection wherein the system includes a controller, a diagnostic module, and an integrated power module having a gate driver with a first level protection circuit, and a power device for driving a load. The gate driver and the first level protection circuit interfaces with the diagnostic module.

In addition, the first level protection circuit comprises the detector for signaling a response to a sensed physical degradation at a level above a threshold level at the power device diagnosed at the integrated power module diagnostic unit. In addition, the present invention provides condition diagnostic protection from which temperature sensing of the layers in a transistor stack represent the level of deterioration over time which is compared to threshold levels in the diagnostic module.

In addition, the present invention provides a method of diagnosing an integrated power module using the gate driver section and a device level protection circuit providing the first level of protection against short circuit, over current, over temperature and under voltage condition in the power driver and diagnosing the sensed condition by comparison with threshold, time-based, predetermined values. Moreover, the present invention provides protection against power cycling failure corresponding to breakage of a wirebond forming a connection with a transistor stack of the power device.

BRIEF DESCRIPTION OF THE DRAWINGS

The present invention will be more clearly understood by reference to the following detailed description in which like reference characters refer to like parts throughout the views and in which.

DETAILED DESCRIPTION OF THE PREFERRED EMBODIMENT

Figure 1:
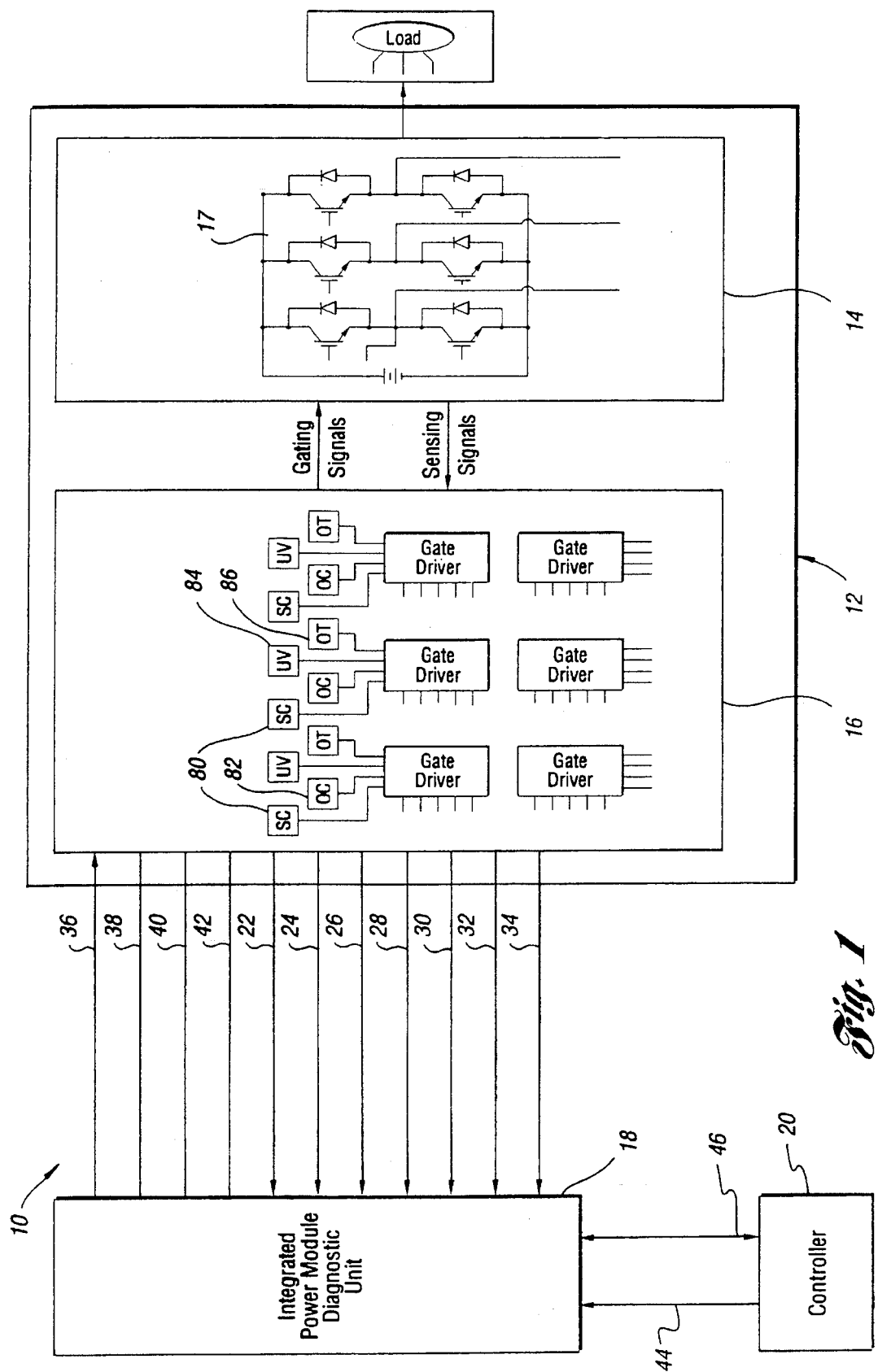
FIG. 1 is a block diagram of a diagnostic system including an integrated power module according to the present invention with a schematic overlay for the sake of clarity.

Referring to FIG. 1, a power device drive system 10 according to the present invention includes an integrated power module 12, for example, as part of a motor vehicle's operating system control. The integrated power module 12 includes power devices 14 and a gate driver circuit 16 with device level protection circuits in the form of sensing apparatus such as current, voltage and temperature sensors. Power devices 14 provide power and energy to the load. The sensors, each part of the circuit for controlling gating to the power devices, provides feedback internally and externally. Each gate driver for each power device receives an input from device level protection circuits 80–86. Each gate driver in circuit 16 applies a gating signal to a power device 14, such as the transistor switches 17 of the invertor shown in the preferred embodiment, in response to commands from the controller unless disenabled in response to the sensors of circuit 16.

Circuit 16 also applies the following feedback signals through connections to a diagnostic module 18: interlock 22, short circuit feedback 24, temperature feedbacks 26, gate threshold voltages 28, voltage and current sensing 30, over current status 32, and under voltage status 34. The system diagnostic module 18 transmits the commands for gating signals 36 from controller 20 to circuit 16 under normal operating conditions and reports operating conditions to the controller 20.

Common to both module 18 and circuit 16 are lines for power 38, power supply ground 40, and signal ground 42. The controller 20 is coupled to module 18 by address lines 44 for communication and by data lines 46 which are two-way connections between module 18 and controller 20. The data lines may include status lines for flagging and interrupts in response to reports on faults as described in detail below. As schematically represented in FIG. 1, the power devices may be power MOS devices such as insulated gate, Bi-polar junction transistors (IGBT), for example, metal oxide field effect transistors (MOSFET), arranged in a 3-phase bridge configuration forming a drive inverter for a 3-phase motor.

Figure 2:
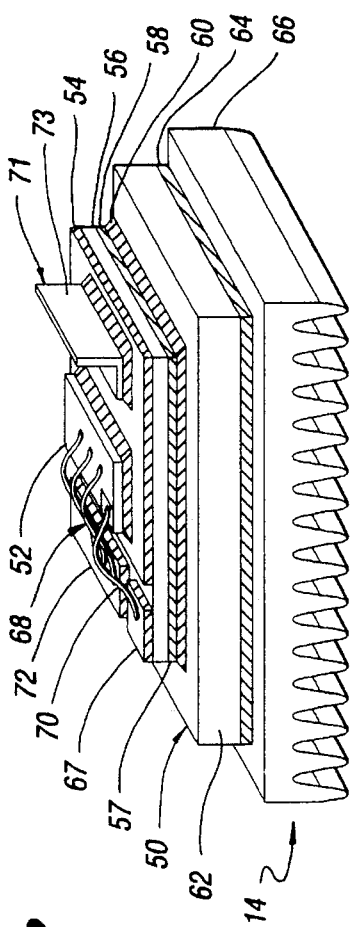
FIG. 2 is a perspective representation of a transistor power stack being monitored in the integrated power module according to the present invention.

Referring now to FIG. 2, a sample physical transistor stack 50 used to make a preferred form of power switch 14 includes a plurality of layers. The layers include a silicon die 52, the top side of the die being the emitter and the bottom side of the die being the collector. A wirebond 68 connects the emitter with a metal land pattern 72 and another wirebond connects a gate of the die 52 to a metal land pattern 67. The collector connection 73 is formed with a lead frame 71 adjacent to and spaced from silicon die 52. Similar lead frames 71 may be coupled to emitter metal land 72 and to gate metal land 67 in a similar manner for external connection to leads of the system.

A solder layer 56 joins the silicon die 52 to an insulating, thermally conductive substrate that can be made of different types of ceramic or polymer materials. A layer of the material is covered by bonded or printed thermally conductive layers 54 and 57, preferably metal, such as direct bond copper material, thick film hybrid material, thin film hybrid material or insulating metal substrate, to improve the solder connection.

The substrate is, in turn, connected at its layer 57 by the solder layer 60 to a base plate or casing 62. The casing, or base plate 62, is in turn joined by a pad or layer of thermal grease 64 to a heat sink 66, preferably made of metal such as aluminum. The temperature of the junction $T_j$ may be compared with the temperatures $T_c$ at the casing or baseplate as well as the temperature $T_s$ at the heat sink as discussed in greater detail below, to provide sense signals that take advantage of the circuit protection and diagnosis according to the present invention.

Each wirebond comprises a plurality of individual strands of wire 70 coupling each silicon die segment 52 with the connector plate. As the wirebond 68 wears in response to repeated power cycling, the breakage of an individual strand results in a greater current flow through the remaining strands.

This would hasten deterioration of the remaining wirebond strands if current flow through them is not reduced. Accordingly, sensing of current through a wirebond 68 for each segment of a silicon die 52 can provide an indication of the power cycling failure. When the current value has reached a threshold level over time, at which the actual on-state voltage exceeds the predetermined level of appropriate on-state voltage by a set amount, a fault in the wirebond is identified. The diagnostic module 18 communicates this status so that the controller will be able to react appropriately, for example, reduce the current command, based on the operation of the system protection and diagnostic module 18.

Figure 4:
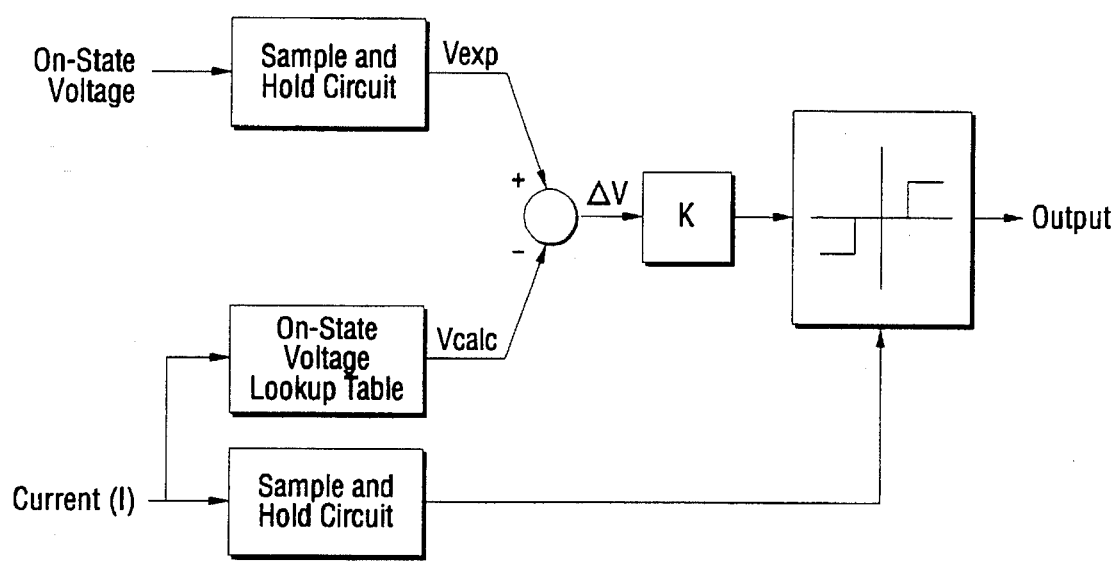
FIG. 4 is a power cycling failure diagnosis according to the present invention.

As shown in FIG. 4, a block diagram describing the power cycling failure diagnosis is provided. The on-state voltage across the device 14 and more particularly, the switch 17, as well as the current through the device, are monitored periodically. For a specific device current, the measured on-state voltage across the switch is compared against a value obtained from a look-up table. The difference or the deviation is an indication of the integrity of the wirebonds and the level of deterioration to power cycling.

The system diagnostic module 18 also provides a second level of protection. It feeds power signal 38 and the controller gating signals 36 to the integrated module 12. There is an interlock feedback signal 22 which is connected to the power line at the integrated power module 12. This would allow the system diagnosis module 18 to make sure that the power connection to the gate drivers of the integrated module is established properly before the main high voltage contact applies power to the main invertor. The integrated power module 12 would feedback status to the system diagnosis module 18, including short circuit condition sensed at 80 as shown at 24, die, substrate, and heat sink temperatures $T_j$, $T_c$ and $T_s$, sensed at 86 as shown at 26, over current condition sensed at 82 as shown at 32, under voltage condition sensed at 84 as shown at 34, gate threshold voltage as shown at 28, and voltage and load current sensor outputs as shown at 30. The system diagnosis module 18 would record these status data and time stamp the same. This data can be stored at certain intervals and the data is intelligently maintained by a digital circuit such that the memory space in the diagnostic module is well utilized. For example, the data is used per the algorithms in FIGS. 3 and 4 to study any trends that might possibly exist.

The power devices 17 of module 14 have a specific short circuit rating issued by the manufacturer. However, while the manufacturer does provide information of the current through the device that can be handled without damage to the device, the fact that the device is able to withstand only a certain number of short circuits remains unaddressed. Moreover, although ideally the device would never be subjected to a short circuit, noise, certain spurious signals and intermittent faults could lead to a short circuit condition. Therefore, the system diagnosis module 18 counts the number of short circuits along with certain current and voltage load data and keeps track of the same. The load data may be analyzed to infer the type of problem being encountered as a cause of the short circuit. If the detected value of exceeds a certain value or number of short circuits, the controller 20 would be notified by a status signal and this could flag the condition for identification while diagnosing the problem on board to determine if an interrupt is to be enacted, or diagnosing the problem at the service station during a maintenance inspection.

The module and sink temperatures at a certain load current value are captured and stored on a day-to-day basis and the trend would be monitored. This information can then be used to predict any change in the module's thermal resistance or possible degradation of the cooling system. Also, during over temperature condition the commanded current from the controller could be reduced or the inverter could be gradually shutdown with an accompanying warning, such as a malfunction indicator light (MIL), such that the driver would have enough time to react, for example, to pull the vehicle to a parking area if used for diagnosing power devices used in a motor vehicle power steering system.

Figure 3:
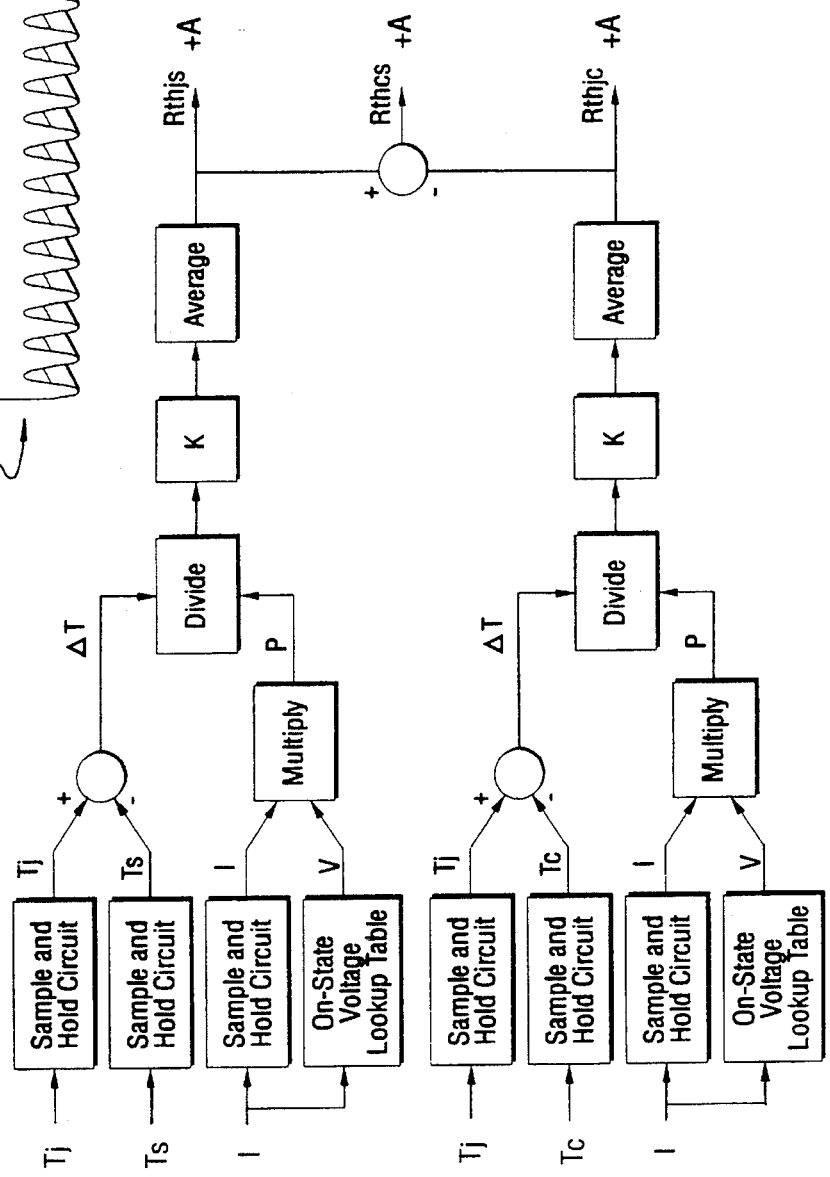
FIG. 3 is a logic block diagram demonstrating a transistor stack failure diagnosis according to the present invention.

A block diagram describing the transistor stack failure diagnosis approach is shown in FIG. 3. The junction temperature $T_j$, case temperature $T_c$, sink temperature $T_s$ and device current are monitored periodically. Using this information by diagnosis in accordance with FIG. 3, the junction to case thermal resistance ($R_{thjc}$), case to sink thermal resistance ($R_{thcs}$) and junction to sink thermal resistance ($R_{thjs}$) would be calculated. These would be stored to study the trend to determine if the solder interfaces (silicon die 52 to substrate plate 54, the substrate plate 57 to base plate 62 interface or the case 62 to sink 67 interface at the thermal grease or thermal pad layer 64) are degrading over time. The module determines if the vehicle needs servicing to ensure that the inverter operates within standard operating conditions. As shown in FIG. 3, the difference between the junction temperature $T_j$ and the heat sink temperature $T_s$ is divided by the power to provide thermal resistance adjusted by the factor K to produce an average thermal resistance $R_{thjs}$. The factor K is determined from the scaling factors of the current and voltage sensors that deliver signal 30 and are used in power calculations. K is also determined from the thermal characteristics of the power module supplied by the manufacturer and the thermal characteristics of the heat sink. In practice, K is derived so that thermal resistances $R_{thjc}$ and $R_{thjs}$ match the designed values at the beginning of the service life of electronic power module 12.

The commanded current from the controller 20 and the overcurrent information 32 would be recorded at periodic intervals. An over current condition situation could arise if one of the dies 52 is open and the other dies 52 in parallel are passing more current. Also, current sensor failure or degradation could lead to an over current situation. The recorded over current information 32 could be used to generate responses designed to take corrective action to overcome the problem without destroying the inverter by continued use under excessive, unrated conditions. A response could allow the controller 20 to gradually shut down the inverter and notify the driver with a malfunction indicator light (MIL) or otherwise flag the condition for identification during computer-monitored inspection of the controller.

During an under-voltage condition signal 34, the inverter would be shut down and the information would be recorded at a certain memory location. Such data could be designated by a flag that would be useful to report the problem and diagnose the problem by computer monitoring at a service station.

The characteristics of the power device 14 can change over time and this depends on the state of the Si—SiO$_2$ interface, integrity of the gate oxide film, and defects in the passivation layer that protects the die from moisture and contamination, that are affected by external factors, such as, temperature and humidity. Some of the failures would lead to a shift in gate threshold voltage 28, therefore, the shift in gate threshold voltage 28 may be used to predict any possible power device degradation. However, in view of conventional product tolerances, the gate constructions cause variances that must be normalized before the sensed condition can be diagnosed, and substantially increase the difficulty of automatically responding to or reporting a dangerous or damaging operations condition.

In summary, the main features and the function of the Integrated Power Module Diagnostic System 10 according to the preferred embodiment are described above. The diagnostic module 18 unit diagnoses the problems in the power module 14 and also monitors the slow degradation of the module 14 over time. The unit diagnoses undervoltage condition, short circuit condition and the number of short circuit events, and sensor failure by over current and deviations from command voltages and currents, as well as transistor stack degradation due to thermal cycling, and wirebond breakage due to power cycling.

Having thus described the present invention, various modifications will no doubt occur to those skilled in the art to which this invention pertains without departing from the scope and spirit as defined in the appended claims.

What is claimed is:

1. An integrated power module for driving a load device in a motor vehicle comprising:

a gate driver including at least one gate voltage circuit;

at least one power driver driven by said at least one gate voltage circuit;

at least one protector including a detector circuit for generating a signal in response to a temperature reading indicative of physical condition of said power driver; and, a diagnostic monitor for analyzing the temperature reading in respect to past temperature readings to determine the level of physical degradation of said power driver over time.

2. An integrated power module of claim 1 wherein said power driver comprises a transistor stack including a plurality of layers, each layer joined to an adjacent layer by a junction, wherein said predetermined level of physical degradation pertains to at least one junction.

3. An integrated power module of claim 2 wherein said at least one junction comprises a silicon die to substrate interface.

4. An integrated power module of claim 2 wherein said at least one junction comprises a substrate to baseplate interface.

5. An integrated power module of claim 2 wherein said at least one junction comprises a casing to heat sink interface.

6. An integrated power module of claim 2 wherein said junction comprises a wirebond to said transistor stack.

7. A power device drive system with condition diagnostic protection comprising:

a controller;

a diagnostic module interfacing with said controller via address lines and data lines including status lines;

an integrated power module having a gate driver with a first level protection circuit, and a power device for driving a load;

wherein said gate driver and said first level protection circuit interface with said system protection and diagnostic module; and wherein said first level protection circuit comprises a detector for signaling a response to a sensed fault related to physical degradation, wherein said diagnostic module periodically accumulates a representative value of response and determines when said signaling response is at a repetition or time-based level above a repetition or time-based threshold level at said power device.

8. A power device drive system of claim 7 wherein said diagnostic module includes a second level of protection responsive to said representative value of response when said repetition or time-based level is above said threshold level.

9. A power device drive system of claim 7 wherein said integrated power module includes a transistor stack, wherein said physical degradation comprises a junction deterioration in said transistor stack, and wherein said detector comprises a temperature sensor.

10. A power device drive system of claim 7 wherein said integrated power module includes a transistor stack coupled by a wirebond to a conductor, and wherein said physical degradation comprises a break in said wirebond.

11. A method of diagnosing an integrated power module including uncovering possible failure such as power device failure, transistor stack failure, gate driver failure, power failure and erroneous input commands, including the steps of:

using a gate driver section and a device level protection circuit for providing a first level of protection against short circuit, over current, over temperature and under voltage conditions, by sensing such conditions in the power module, disabling the power devices coupled to the protection circuit in response to a detection of a predetermined level of sensed condition, and reporting the status to a controller; and using a diagnostic module as a second level of protection to analyze said sensed condition by periodically storing accumulating data and a time stamp of recording for comparison with a threshold value and generating at least one of a status signal and a command signal to at least one of said controller and said driver, respectively.

* * * * *